US008984373B2

(12) United States Patent
Yang

(10) Patent No.: US 8,984,373 B2

(45) Date of Patent: Mar. 17, 2015

(54) METHOD FOR ACCESSING FLASH MEMORY AND ASSOCIATED FLASH MEMORY CONTROLLER

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 164 days.

(21) Appl. No.: 13/402,596

(22) Filed: Feb. 22, 2012

(65) Prior Publication Data

US 2013/0219247 A1 Aug. 22, 2013

(51) Int. Cl.

*G11C 29/00* (2006.01)
*G06F 11/10* (2006.01)
*G06F 13/16* (2006.01)

(52) U.S. Cl.

CPC ............ *G06F 11/1048* (2013.01); *G06F 13/16* (2013.01)
USPC .................................. 714/766; 714/E11.054

(58) Field of Classification Search

CPC ..... G06F 11/1048; G06F 13/16; G11C 16/00; G11C 16/10; G11C 2029/0411; G11C 7/1006; H04L 25/03133
USPC ................... 714/766, E11.054; 711/E12.001, 711/E12.008, 103, 104, 154; 375/232, 355; 327/100; 333/18
See application file for complete search history.

(56) References Cited

U.S. PATENT DOCUMENTS

2005/0044465 A1* 2/2005 Peng ............................ 714/755
2008/0027734 A1* 1/2008 Zhao et al. .................... 704/502
2009/0113269 A1* 4/2009 Senoo .......................... 714/752
2010/0088574 A1 4/2010 Kim et al.
2010/0306619 A1* 12/2010 Yang ............................ 714/758
2013/0124781 A1* 5/2013 Sadashivappa .............. 711/103

FOREIGN PATENT DOCUMENTS

JP 2010503883 A 2/2010
KR 20070114235 A 11/2007
KR 20090118060 A 11/2009
KR 20100039647 A 4/2010

OTHER PUBLICATIONS

Office Action of corresponding KR application, published on Feb. 17, 2014.
Notice of Allowance of corresponding KR application, published on Oct. 8, 2014.

* cited by examiner

*Primary Examiner* — Guy Lamarre
(74) *Attorney, Agent, or Firm* — Wang Law Firm, Inc.; Li K. Wang; Stephen Hsu

(57) ABSTRACT

An exemplary method for accessing a flash memory. The method comprising obtaining a first random sequence; utilizing the first random sequence as a first seed for generating a second random sequence, wherein the first random sequence is not equivalent to the second random sequence; scrambling data according to the second random sequence for generating scrambled data; performing an error correction encoding operation upon the first random sequence and the scrambled data for generating parity check code; and storing the scrambled data and the parity check code to the flash memory.

18 Claims, 5 Drawing Sheets

METHOD FOR ACCESSING FLASH MEMORY AND ASSOCIATED FLASH MEMORY CONTROLLER

BACKGROUND OF THE INVENTION

1. Field of the Invention

The present invention relates to access to a flash memory, and more particularly, to a method for performing data pattern management regarding data accessed by a controller of a flash memory, and to an associated memory device and a controller thereof.

2. Description of the Prior Art

As technologies of flash memories progress in recent years, many kinds of portable memory devices, such as memory cards respectively complying with SD/MMC, CF, MS, and XD standards, solid state disks (SSD), and embedded Multi Media Card (eMMC) are widely implemented in various applications. Therefore, the control of access to flash memories in these memory devices has become an important issue.

Taking NAND flash memories as an example, they can mainly be divided into two types, i.e. Single Level Cell (SLC) flash memories and Multiple Level Cell (MLC) flash memories. Each transistor that is considered a memory cell in SLC flash memories only has two charge levels that respectively represent a logical value 0 and a logical value 1. In addition, the storage capability of each transistor that is considered a memory cell in MLC flash memories can be fully utilized. More specifically, the voltage for driving memory cells in the MLC flash memories is typically higher than that in the SLC flash memories, and different voltage levels can be applied to the memory cells in the MLC flash memories in order to record information of multi bits (e.g. two bits binary values 00, 01, 11, or 10) in a transistor that is considered a memory cell. Theoretically, the storage density of the MLC flash memories may reach more than twice the storage density of the SLC flash memories, which is considered good news for NAND flash memory manufacturers who encountered a bottleneck of NAND flash technologies.

As MLC flash memories are cheaper than SLC flash memories, and are capable of providing higher capacity than SLC flash memories while the space is limited, MLC flash memories have been a main stream for implementation of most memory devices on the market. However, various problems of the MLC flash memories have arisen due to their unstable characteristics. In order to ensure that the access control of a memory device over the flash memory therein can comply with related standards, the controller of the flash memory should have some handling mechanisms in order to properly handle its data access operations.

According to the related art, the memory device having the aforementioned handling mechanisms may still suffer from some deficiencies. For example, due to usage behaviors of the user, data of some specific data patterns would probably be constantly written into the same logical address of the flash memory, where these specific data patterns may easily cause errors such as write/program errors, read errors, etc. Therefore, a novel method is required for performing data pattern management regarding data accessed by the controller in order to reduce the probability of error occurrence.

SUMMARY OF THE INVENTION

In accordance with exemplary embodiments of the present invention, a method for accessing a flash memory by introducing a random seed for generating a random sequence is proposed to solve the above-mentioned problem.

According to an aspect of the present invention, an exemplary method for accessing a flash memory is disclosed. The method comprising obtaining a first random sequence; utilizing the first random sequence as a first seed for generating a second random sequence, wherein the first random sequence is not equivalent to the second random sequence; scrambling data according to the second random sequence for generating scrambled data; performing an error correction encoding operation upon the first random sequence and the scrambled data for generating parity check code; and storing the scrambled data and the parity check code to the flash memory.

According to an aspect of the present invention, an exemplary method for accessing a flash memory is disclosed. The method comprising obtaining a first random sequence; utilizing the first random sequence as a first seed for generating a second random sequence, wherein the first random sequence is not equivalent to the second random sequence; performing an error correction encoding operation upon data and the first random sequence for generating parity check code; scrambling the data and the parity check code according to the second random sequence for generating scrambled data; and storing the scrambled data to the flash memory.

According to an aspect of the present invention, an exemplary flash memory controller for controlling a flash memory is disclosed. The flash memory controller comprising: a seed generator, for obtaining a first random sequence and utilizing the first random sequence as a first seed for generating a second random sequence, wherein the first random sequence is not equivalent to the second random sequence; a scrambling unit, coupled to the seed generator, for scrambling data according to the second random sequence for generating scrambled data; an error correction circuit, coupled to the scrambling unit, for performing an error correction encoding operation upon the scrambled data and the first random sequence for generating parity check code; and a control unit, for controlling the flash memory to store the scrambled data and the parity check code.

According to an aspect of the present invention, an exemplary flash memory controller for controlling a flash memory is disclosed. The flash memory controller comprising: a seed generator, for obtaining a first random sequence and for utilizing the first random sequence as a first seed for generating a second random sequence, wherein the first random sequence is not equivalent to the second random sequence; an error correction circuit, for performing an error correction encoding operation upon data for generating parity check code; a scrambling unit, coupled to the seed generator and the error correction circuit, for scrambling the data and the parity check code according to the second random sequence for generating scrambled data; and a control unit, for controlling the flash memory to store the scrambled data.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
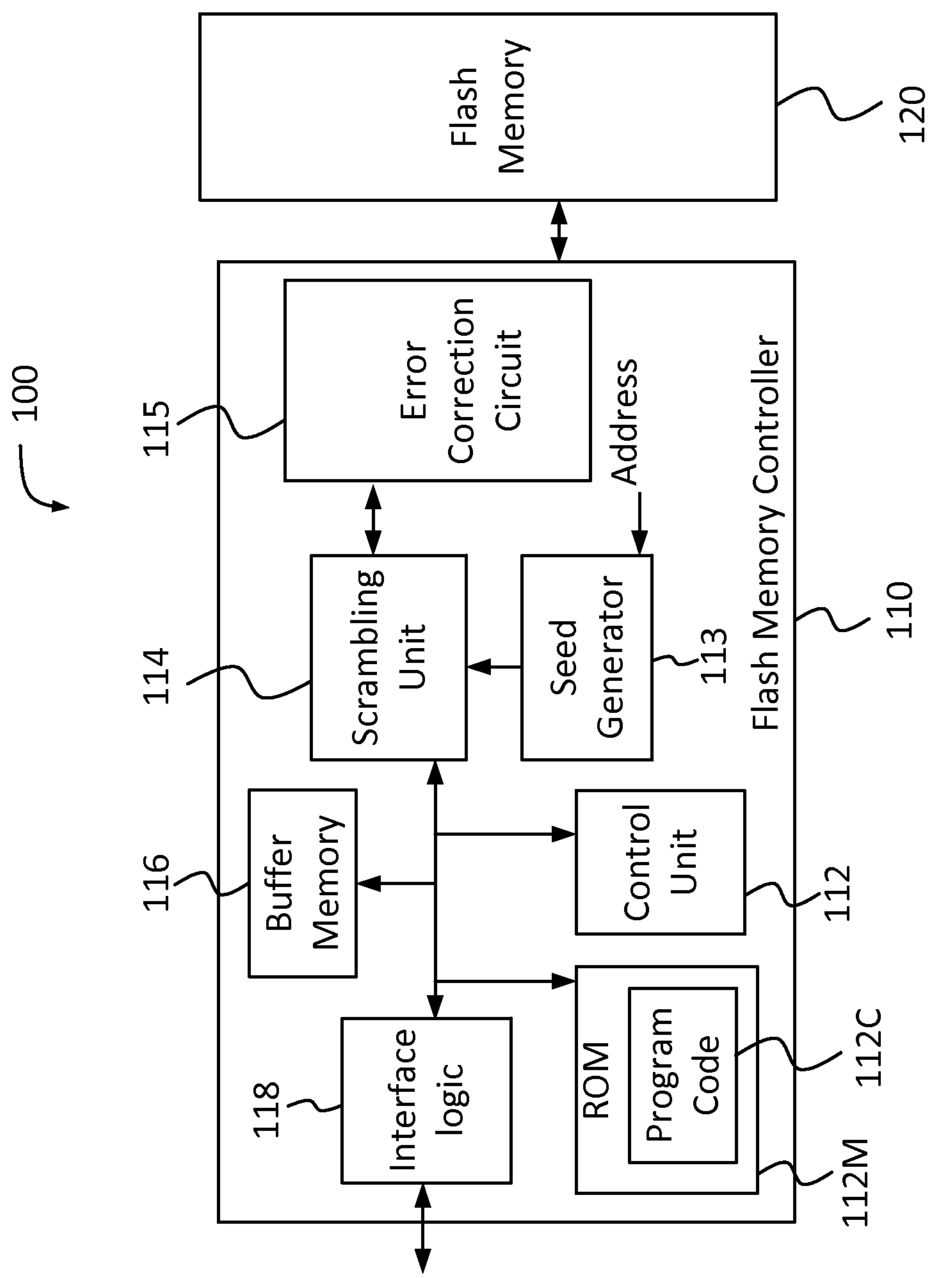
FIG. 1 illustrates a diagram of a memory device 100 according to a first embodiment of the present invention.

Please refer to FIG. 1, which illustrates a diagram of a memory device 100 according to a first embodiment of the present invention. In particular, the memory device 100 of this embodiment is a memory device, examples of which may include, but not limited to, memory cards complying with SD/MMC, CF, MS, or XD standards, Universal Serial Bus (USB) Flash drives (which can be referred to as USB Flash disks), solid state drives (SSD), and embedded Multi Media Card (eMMC). The memory device 100 comprises a flash memory 120, and further comprises a controller arranged to access the flash memory 120, where the aforementioned controller of this embodiment is a flash memory controller 110. According to this embodiment, the flash memory controller 110 comprises a control unit 112, a read only memory (ROM) 112M, a seed generator 113, a scrambling unit 114, an error correction circuit (ECC circuit) 115, a buffer memory 116 and an interface logic 118. Please note that only the elements pertinent to the technical features of the present invention are shown in FIG. 1. That is, the memory device 100 may include additional elements to support other functionality.

In this embodiment, the ROM 112M is arranged to store a program code 112C, and the control unit 112 is arranged to execute the program code 112C to control the access to the flash memory 120. Typically, the flash memory 120 comprises a plurality of blocks, and the flash memory controller performs data erasure operations on the flash memory 120 by erasing in units of blocks. In addition, a block can be utilized for recording a specific amount of pages, where the flash memory controller 110 performs writing (storing) operations on the flash memory 120 by controlling the flash memory 120 to perform write/program operations in units of pages. In addition, a page can comprise a plurality of sectors, where the flash memory controller 110 performs reading operations on the flash memory 120 by controlling the flash memory 120 to perform read operations in units of sectors.

In practice, the flash memory controller 110 that executes the program code 112C by utilizing the control unit 112 is capable of performing various control operations by utilizing the internal components within the flash memory controller 110. For example, the flash memory controller 110 utilizes the buffer memory 116 to perform buffering operations for the flash memory controller 110, and utilizes the interface logic 118 to communicate with a host device (not shown in FIG. 1). According to this embodiment, in addition to accessing the flash memory 120, the flash memory controller 110 is capable of properly managing the plurality of blocks.

In addition, the flash memory controller 110 can further perform data pattern management regarding data accessed by the flash memory controller 110. In an embodiment of a write operation, the seed generator 113 is for obtaining a first random sequence and utilizing the first random sequence as a first seed for generating a second random sequence. The first random sequence is not equivalent to the second random sequence. The scrambling unit 114 is coupled to the seed generator 113, and is for scrambling data according to the second random sequence for generating scrambled data. Please note that the scrambling unit 114 generates a particular random sequence (second random sequence) according to the seed. The error correction circuit 115 is coupled to the scrambling unit 114, and is for performing an error correction encoding operation upon the scrambled data for generating parity check code. The control unit 112 stores the scrambled data and the parity check code to the flash memory 120 by control the flash memory 120 to perform the write operation. Further details are illustrated below.

Figure 2:
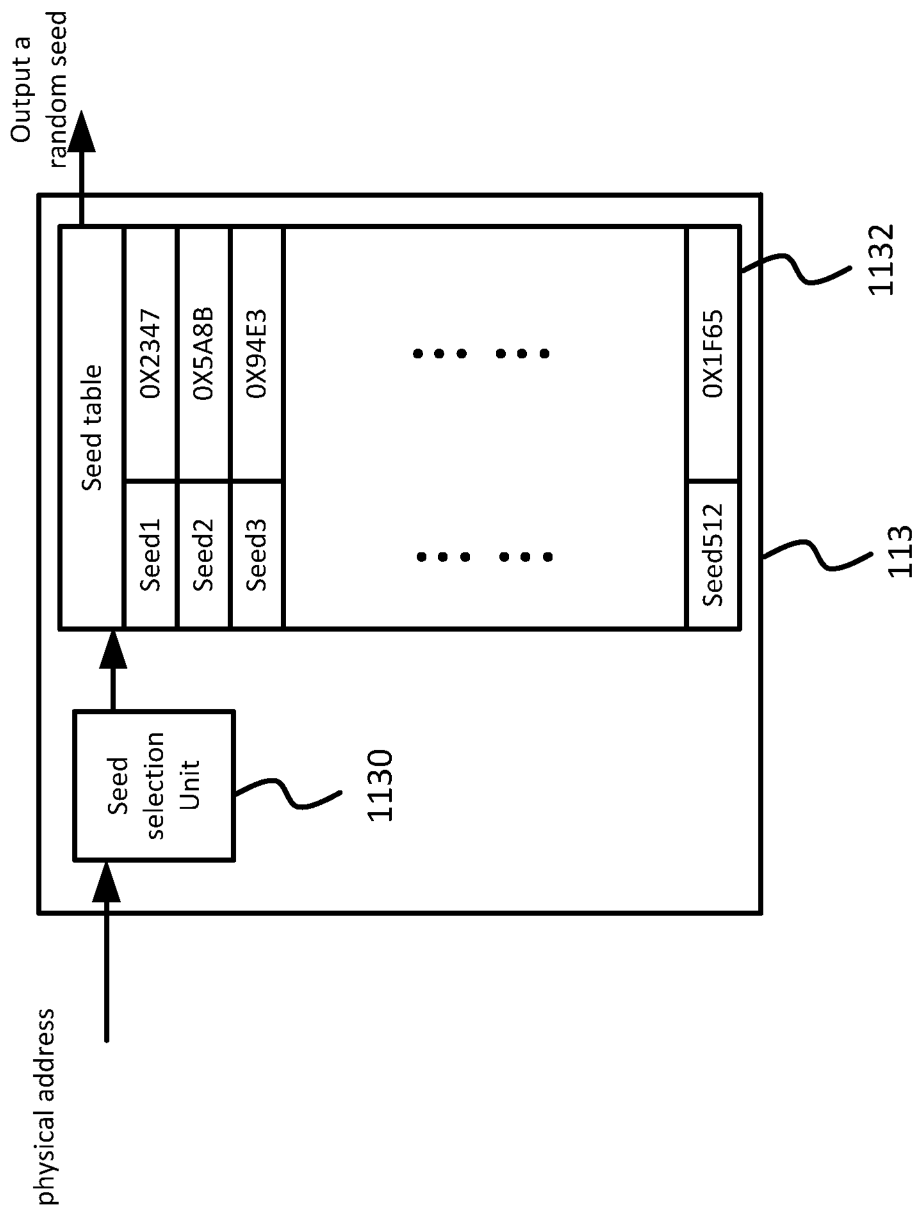
FIG. 2 is a diagram for illustrating an embodiment of the seed generator 113.

Please refer to FIG. 2. FIG. 2 is a diagram for illustrating an embodiment of the seed generator 113. The seed generator comprises a seed selection unit 1130 and a seed table 1132. For performing a write operation, the control unit 112 determines a physical address of the flash memory 120 for writing (storing) data. The data may be suitable to be stored in a physical page of the flash memory 120. The flash memory 120 determines a physical block address and a physical page address for storing the data. The seed generator 113 generates a first random sequence as a seed for a second random sequence by searching a lookup table according to the physical address. The seed generator 113 receives a physical address (e.g. a block address or page address for storing the data). The seed selection unit 1130 selects a particular seed according to the physical address. For example, physical block 1 and physical page 1 maps to seed3, and physical block 1 and physical page 2 maps to seed512. A large size seed table is utilized for guarantee the entropy of the generated seed. The content of the seed is determined according to the mapped seed. For example, the physical block 1 and physical page 1 map to seed3, and the content of the seed3 is 0X94E3.

The seed is provided to the scrambling unit 114. The scrambling unit 114 generates the second random sequence according to the seed. The scrambling unit 114 may comprises a linear feed back shift register (LFSR, not shown in FIG. 1). The LFSR implements a polynomial, e.g. $f(X)=x^{14}+x^{13}+x^{12}+x^{2}+1$. The seed can determine the initial state of the LFSR and determined a particular random sequence (i.e. the second random sequence) that generated by the LFSR. The scrambling unit 114 scrambles data according to the second random sequence for generating scrambled data. For example, the scrambling unit 114 performs a XOR operation bit by bit upon the second random sequence and the data for the generating scrambled data. The error correction circuit 115 performs an error correction encoding operation upon the scrambled data for generating parity check code. The control unit 112 controls the flash memory 120 to store the scrambled data and the parity check code. In this way, each page of data stored in the flash memory 120 can be well protected and scrambled by different random sequences that generated according to different seeds. The seeds of pages of a block are different. Hence, the data patterns of pages of a block are different.

Figure 3:
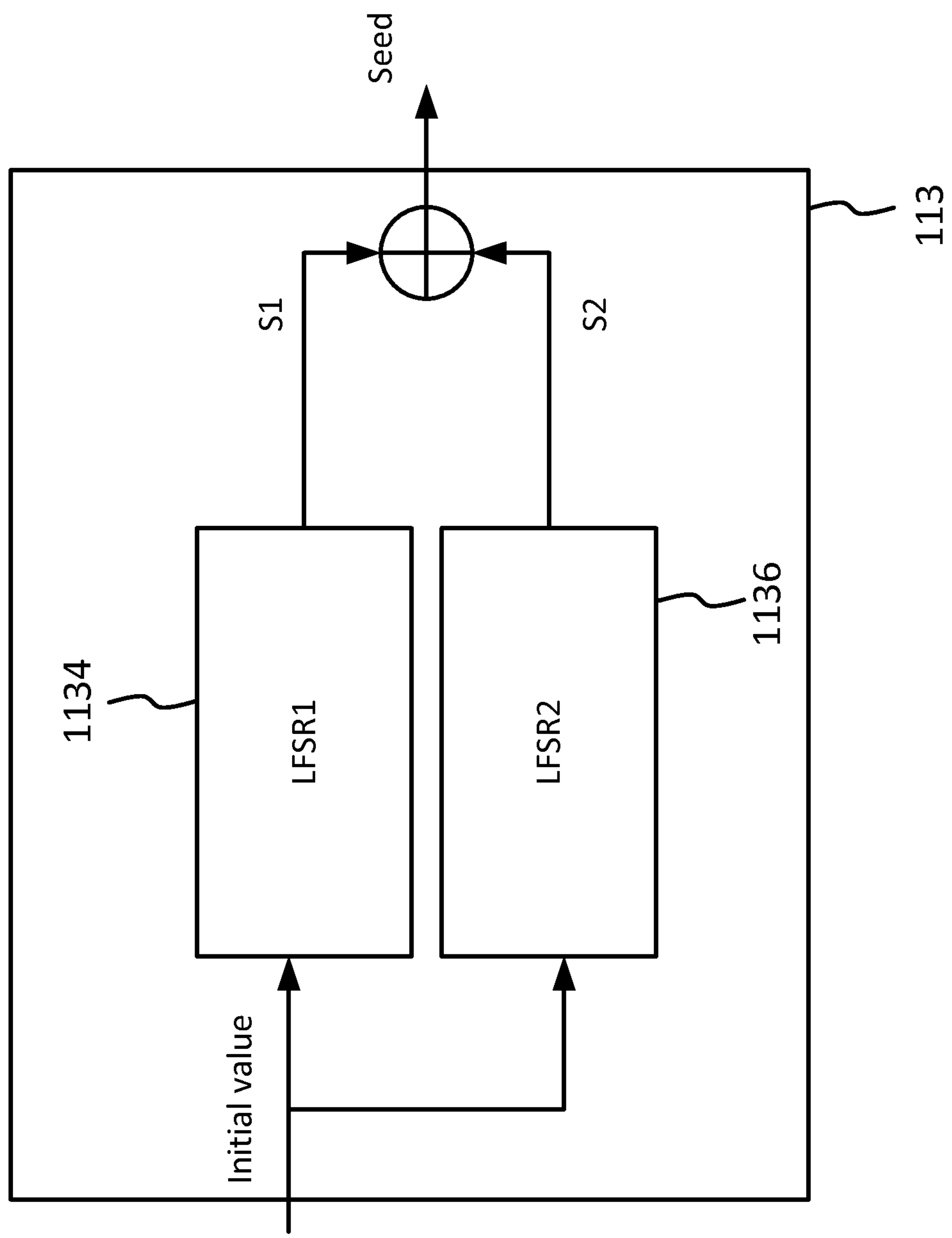
FIG. 3 is a diagram for illustrating another embodiment of the seed generator 113.

Please refer to FIG. 3. FIG. 3 is a diagram for illustrating another embodiment of the seed generator 113. The seed generator 113 comprises LFSR1 1134 and LFSR2 1136. The LFSR1 1134 and LFSR2 1136 implement different polynomials, respectively. The LFSR1 1134 and LFSR2 1136 receive the same initial value. The initial value can be sampled from a noise source or can be obtained from an address. The address can be a physical address or a logical address. For example, the host device requests the memory device 100 to store a page of data having a particular logical page address. The memory device 100 stores the page of data into a particular physical page of a particular physical block of the flash memory 120. Anyone of the logical page address, the physical page address of the particular physical page, and the physical block address of the particular physical block can be the initial value. The LFSR1 1134 and LFSR2 1136 that implement different polynomials, respectively receive the same initial value and generate different random sequences, i.e. S1 and S2. The seed, i.e. the first random sequence, is generated according to the random sequences S1 and S2, e.g. performing XOR operation upon the random sequences S1 and S2 bit by bit to generate the seed.

Similarly, the seed is provided to the scrambling unit 114. The scrambling unit 114 generates the second random sequence according to the seed. The scrambling unit 114 may comprises a LFSR (not shown in FIG. 1). The LFSR implements a polynomial, e.g. $f(X)=x^{14}+x^{13}+x^{12}+x^{2}+1$. The seed can determine the initial state of the LFSR and determined a particular random sequence (i.e. the second random sequence) that generated by the LFSR. The scrambling unit 114 scrambles data according to the second random sequence for generating scrambled data. For example, the scrambling unit 114 performs a XOR operation bit by bit upon the second random sequence and the data for the generating scrambled data. The error correction circuit 115 performs an error correction encoding operation upon the scrambled data for generating parity check code. The control unit 112 controls the flash memory 120 to store the scrambled data and the parity check code. In this way, each page of data stored in the flash memory 120 can be well protected and scrambled by different random sequences that generated according to different seeds. The seeds of pages of a block are different. Hence, the data patterns of pages of a block are different.

In addition, for obtaining correct data from flash memory 120, the seed for initiating the LFSR should be stored in the flash memory 120 for de-scrambling the scrambled data. In one embodiment, each page of data maps to a particular seed. The page of data is properly scrambled according to the second random sequence that initiated by the particular seed. The particular seed and the scrambled data that scrambled from the page of data can be stored (programmed) in the same physical page of flash memory. The control unit 112 can control the flash memory 120 to read out the scrambled data and the particular seed in the same physical page. Thus, the de-scrambling operation can be done easily. Further details will be illustrated below.

Figure 4:
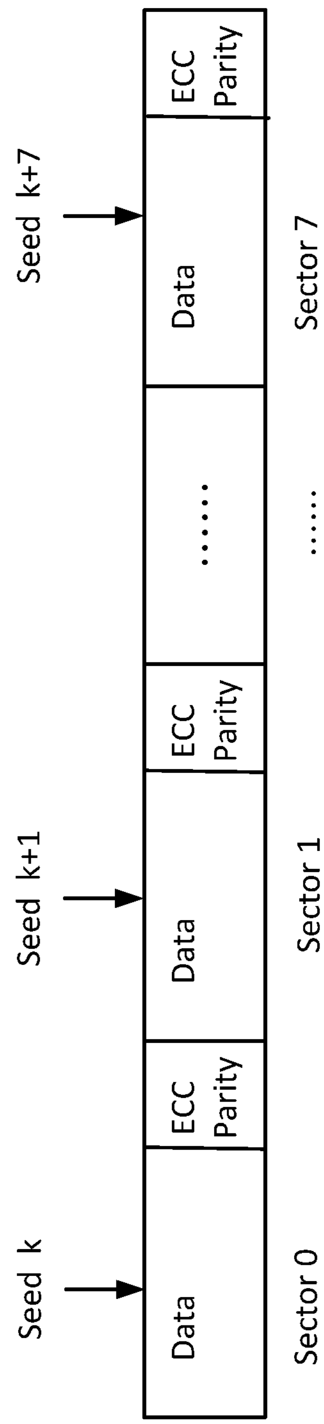
FIG. 4 is a diagram illustrating each sector of a page of data mapping to different seeds.

Please refer to FIG. 4. FIG. 4 is a diagram illustrating each sector of a page of data mapping to different seeds. The page of data comprises sector 0, sector 1, sector 2, sector 3, sector 4, sector 5, sector 6, and sector 7. An error correction check (ECC) parity (i.e. parity check code) that generated for protecting a sector of data is attached to the sector of data. Each sector of data maps to a different seeds. For example, the sector 0 maps to seed k (e.g. 0x4AE1), the sector 1 maps to seed k+1 (e.g. 0x4AE2), the sector 2 maps to seed k+2 (e.g. 0x4AE3), the sector 3 maps to seed k+3 (e.g. 0x4AE4), the sector 4 maps to seed k+4 (e.g. 0x4AE5), the sector 5 maps to seed k+5 (e.g. 0x4AE6), the sector 6 maps to seed k+6 (e.g. 0x4AE7), and the sector 7 maps to seed k+7 (e.g. 0x4AE8). The set of seed, the seed k, the seed k+1, the seed K+2, the seed k+3, the seed k+4, the seed k+5, the seed K+6, and the seed k+7, are generated by the seed generator 113. The seed generator 113 can generate the seed k according to the embodiments illustrated above and generate the other seeds, the seed k+1, the seed K+2, the seed k+3, the seed k+4, the seed k+5, the seed K+6, and the seed k+7, by adding a set of predetermined number to the seed k. In other words, the seed generator 113 adds a set of predetermined number to the seed k for generating the set of seeds. The set of seeds, the seed k, the seed k+1, the seed K+2, the seed k+3, the seed k+4, the seed k+5, the seed K+6, and the seed k+7, are provided to the scrambling unit 114. The scrambling unit 114 scrambles each sector of the sectors according to each seed of the set of seeds, respectively, for generating the scrambled data. Further details will be illustrated below.

The scrambling unit 114 generates a plurality of random sequences according to the set of seeds. The scrambling unit 114 may comprises a LFSR (not shown in FIG. 1). The LFSR implements a polynomial, e.g. $f(X)=x^{14}+x^{13}+x^{12}+x^{2}+1$. The seed can determine the initial state of the LFSR and determined a plurality of particular random sequences (e.g. random sequence RS0 generated according to seed k, random sequence RS1 generated according to seed k+1, random sequence RS2 generated according to seed k+2, random sequence RS3 generated according to seed k+3, random sequence RS4 generated according to seed k+4, random sequence RS5 generated according to seed k+5, random sequence RS6 generated according to seed k+6, and random sequence RS7 generated according to seed k+7) that generated by the LFSR. The scrambling unit 114 scrambles data according to the plurality of random sequences for generating scrambled data. For example, the scrambling unit 114 performs a XOR operation bit by bit upon the plurality of random sequences and each sector of data, respectively, for the generating scrambled data. The scrambling unit 114 performs a XOR operation bit by bit upon the random sequence RS0 and the sector 0 to generate a scrambled sector of data. The scrambling unit 114 performs a XOR operation bit by bit upon the random sequence RS1 and the sector 1 to generate a scrambled sector of data. The scrambling unit 114 performs a XOR operation bit by bit upon the random sequence RS2 and the sector 2 to generate a scrambled sector of data. The scrambling unit 114 performs a XOR operation bit by bit upon the random sequence RS3 and the sector 3 to generate a scrambled sector of data. The scrambling unit 114 performs a XOR operation bit by bit upon the random sequence RS4 and the sector 4 to generate a scrambled sector of data. The scrambling unit 114 performs a XOR operation bit by bit upon the random sequence RS5 and the sector 5 to generate a scrambled sector of data. The scrambling unit 114 performs a XOR operation bit by bit upon the random sequence RS6 and the sector 6 to generate a scrambled sector of data. The scrambling unit 114 performs a XOR operation bit by bit upon the random sequence RS7 and the sector 7 to generate a scrambled sector of data.

In addition, for obtaining correct data from flash memory 120, the seed for initiating the LFSR should be stored in the flash memory 120 for de-scrambling the scrambled data. In one embodiment, each sector of data maps to a particular seed. The page of data is properly scrambled according to a plurality of random sequences that initiated by the set of seeds. Since the set of seeds are generated according to a particular seed, e.g. seed k. The particular seed (e.g. seed k) and the scrambled data that scrambled from the page of data can be stored (programmed) in the same physical page of flash memory. The control unit 112 can control the flash memory 120 to read out the scrambled data and the particular seed (e.g. seed k) in the same physical page. Thus, the de-scrambling operation can be done easily. Further details will be illustrated below.

For obtaining correct data from flash memory 120, the control unit 112 controls the flash memory 120 to read a page of data. The page of data comprises the scrambled data, the first random sequence (i.e. the seed), and the parity check code. The error correction circuit 115 performs an error correction decoding operation upon the first random sequence, the scrambled data and the parity check code for check the correctness of the first random sequence and the scrambled data. While the correctness of the first random sequence and the scrambled data is approved, the scrambling unit 114 generates the second random sequence according to the first random sequence that read from the flash memory. The scrambling unit 114 performs a de-scrambling operation upon the scrambled data according to the second random sequence. In this way, the correct data can be obtained.

In another embodiment, each sector of a page of data maps to different seeds. For obtaining correct data from flash memory 120, the control unit 112 controls the flash memory 120 to read a page of data. The page of data comprises the scrambled data, the first random sequence (i.e. the seed), and the parity check code. The error correction circuit 115 performs an error correction decoding operation upon the first random sequence, the scrambled data and the parity check code for check the correctness of the first random sequence and the scrambled data. While the correctness of the first random sequence and the scrambled data is approved, the seed generator 114 generates the sets of seeds according to the first random sequence read from the flash memory 120. For example, the first random sequence is seed k. The seed generator 114 adds a set of predetermined number to the seed k for generating the set of seeds, comprising the seed k, the seed k+1, the seed K+2, the seed k+3, the seed k+4, the seed k+5, the seed K+6, and the seed k+7. The scrambling unit 114 generates a plurality of random sequence, comprising random sequence RS0 generated according to seed k, random sequence RS1 generated according to seed k+1, random sequence RS2 generated according to seed k+2, random sequence RS3 generated according to seed k+3, random sequence RS4 generated according to seed k+4, random sequence RS5 generated according to seed k+5, random sequence RS6 generated according to seed k+6, and random sequence RS7 generated according to seed k+7. The scrambling unit 114 performs a de-scrambling operation upon each sector of the scrambled data according to the plurality of random sequences. For example, the scrambling unit 114 performs a XOR operation bit by bit upon the random sequence RS0 and the scrambled sector 0 to generate a correct sector of data. The scrambling unit 114 performs a XOR operation bit by bit upon the random sequence RS1 and the scrambled sector 1 to generate a correct sector of data. The scrambling unit 114 performs a XOR operation bit by bit upon the random sequence RS2 and the scrambled sector 2 to generate a correct sector of data. The scrambling unit 114 performs a XOR operation bit by bit upon the random sequence RS3 and the scrambled sector 3 to generate a correct sector of data. The scrambling unit 114 performs a XOR operation bit by bit upon the random sequence RS4 and the scrambled sector 4 to generate a correct sector of data. The scrambling unit 114 performs a XOR operation bit by bit upon the random sequence RS5 and the scrambled sector 5 to generate a correct sector of data. The scrambling unit 114 performs a XOR operation bit by bit upon the random sequence RS6 and the scrambled sector 6 to generate a correct sector of data. The scrambling unit 114 performs a XOR operation bit by bit upon the random sequence RS7 and the scrambled sector 7 to generate a correct sector of data. In this way, the correct data can be obtained.

Figure 5:
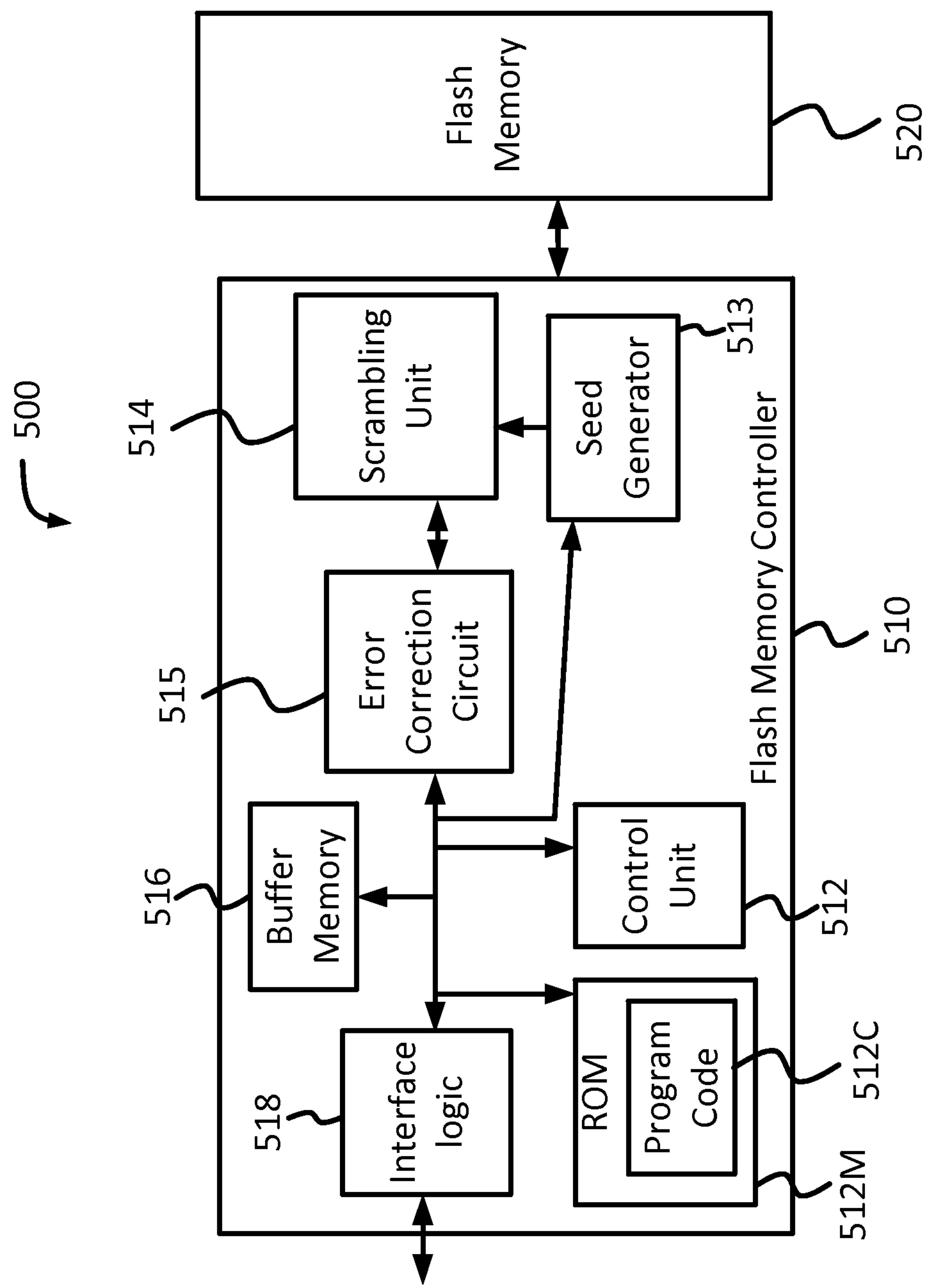
FIG. 5, which illustrates a diagram of a memory device 500 according to another embodiment of the present invention.

Please refer to FIG. 5, which illustrates a diagram of a memory device 500 according to another embodiment of the present invention. In particular, the memory device 500 of this embodiment is a memory device, examples of which may include, but not limited to, memory cards complying with SD/MMC, CF, MS, or XD standards, Universal Serial Bus (USB) Flash drives (which can be referred to as USB Flash disks), solid state drives (SSD), and embedded Multi Media Card (eMMC). The memory device 500 comprises a flash memory 520, and further comprises a controller arranged to access the flash memory 520, where the aforementioned controller of this embodiment is a flash memory controller 510. According to this embodiment, the flash memory controller 510 comprises a control unit 512, a read only memory (ROM) 512M, a seed generator 513, a scrambling unit 514, an error correction circuit (ECC circuit) 515, a buffer memory 516 and an interface logic 518. Please note that only the elements pertinent to the technical features of the present invention are shown in FIG. 5. That is, the memory device 500 may include additional elements to support other functionality.

In this embodiment, the ROM 512M is arranged to store a program code 512C, and the control unit 512 is arranged to execute the program code 512C to control the access to the flash memory 520. Typically, the flash memory 520 comprises a plurality of blocks, and the flash memory controller performs data erasure operations on the flash memory 520 by erasing in units of blocks. In addition, a block can be utilized for recording a specific amount of pages, where the flash memory controller 510 performs writing (storing) operations on the flash memory 520 by controlling the flash memory 520 to perform write/program operations in units of pages. In addition, a page can comprise a plurality of sectors, where the flash memory controller 510 performs reading operations on the flash memory 520 by controlling the flash memory 520 to perform read operations in units of sectors.

In practice, the flash memory controller 510 that executes the program code 512C by utilizing the control unit 512 is capable of performing various control operations by utilizing the internal components within the flash memory controller 510. For example, the flash memory controller 510 utilizes the buffer memory 516 to perform buffering operations for the flash memory controller 510, and utilizes the interface logic 518 to communicate with a host device (not shown in FIG. 1). According to this embodiment, in addition to accessing the flash memory 520, the flash memory controller 510 is capable of properly managing the plurality of blocks.

In addition, the flash memory controller 510 can further perform data pattern management regarding data accessed by the flash memory controller 510. The error correction circuit 515 is coupled to the scrambling unit 114, and is for performing an error correction encoding operation upon the data for generating parity check code. In an embodiment of a write operation, the seed generator 513 is for obtaining a first random sequence and utilizing the first random sequence as a first seed for generating a second random sequence. The first random sequence is not equivalent to the second random sequence. The scrambling unit 514 is coupled to the seed generator 513, and is for scrambling the data and the parity check code according to the second random sequence for generating scrambled data. Please note that the scrambling unit 514 generates a particular random sequence (second random sequence) according to the seed. The control unit 112 stores the scrambled data to the flash memory 120 by control the flash memory 120 to perform the write operation. The detail of generating the seed is similar to the above embodiments. Hence, further illustration is omitted for brevity.

In the present invention, the seed for initiating the scrambling unit is randomly generated. Thus, the data pattern of the scrambled data can be scrambled perfectly. The interference between memory cells can be reduced. Hence, the correctness of the data can be guaranteed.

Those skilled in the art will readily observe that numerous modifications and alterations of the device and method may be made while retaining the teachings of the invention.

What is claimed is:

1. A method for accessing a flash memory, the method comprising:

obtaining a first random sequence;

utilizing the first random sequence as a first seed for generating a second random sequence, wherein the first random sequence is not equivalent to the second random sequence;

scrambling data according to the second random sequence for generating scrambled data;

performing an error correction encoding operation upon the first random sequence and the scrambled data for generating parity check code; and storing the scrambled data and the parity check code to the flash memory, wherein the step of obtaining the first random sequence further comprises:

determining a physical address for storing the scrambled data, wherein the physical address is a page address or a block address of a storage device, and the scrambled data is arranged to be stored in the storage device according to the physical address; and selecting a specific value from a lookup table according to the physical address for generating the first random sequence, wherein the lookup table is arranged to store the relationship between the specific value and the physical address.

2. The method of claim 1, wherein the step of obtaining the first random sequence further comprises:

generating a third random sequence and a fourth random sequence according to a physical address;

generating the first random sequence according to the third random sequence and the fourth random sequence.

3. The method of claim 1, wherein the step of obtaining the first random sequence further comprises:

generating a third random sequence and a fourth random sequence by sampling a noise source;

generating the first random sequence according to the third random sequence and the fourth random sequence.

4. The method of claim 1, further comprises:

storing the first random sequence in the flash memory.

5. The method of claim 4, wherein the step of storing the first random sequence to the flash memory further comprises:

storing the first random sequence and the scrambled data in a physical page.

6. The method of claim 1, wherein the data comprises a plurality of sectors, the method further comprises:

generating a set of seeds according to the first seed; and scrambling each sector of the sectors according to each seed of the set of seeds, respectively, for generating the scrambled data.

7. The method of claim 6, wherein the step of generating a set of seeds according to the first seed further comprises:

adding a set of predetermined number to the first seed for generating the set of seeds.

8. The method of claim 4, further comprising:

reading the first random sequence and the scrambled data from the flash memory;

performing an error correction decoding operation upon the first random sequence, the scrambled data and the parity check code;

generating the second random sequence according to the first random sequence; and performing a de-scrambling operation upon the scrambled data according to the second random sequence.

9. A flash memory controller for controlling a flash memory, the flash memory controller comprising:

a seed generator, for obtaining a first random sequence and utilizing the first random sequence as a first seed for generating a second random sequence, wherein the first random sequence is not equivalent to the second random sequence;

a scrambling unit, coupled to the seed generator, for scrambling data according to the second random sequence for generating scrambled data, wherein the seed generator is further for determining a physical address for storing the scrambled data, and for selecting a specific value from a lookup table according to the physical address for generating the first random sequence, wherein the physical address is a page address or a block address of a storage device, the scrambled data is arranged to be stored in the storage device according to the physical address, and the lookup table is arranged to store the relationship between the specific value and the physical address;

an error correction circuit, coupled to the scrambling unit, for performing an error correction encoding operation upon the scrambled data and the first random sequence for generating parity check code; and a control unit, for controlling the flash memory to store the scrambled data and the parity check code.

10. The flash memory controller of claim 9, wherein the seed generator is further for generating a third random sequence and a fourth random sequence according to a physical address, and for generating the first random sequence according to the third random sequence and the fourth random sequence.

11. The flash memory controller of claim 9, wherein the seed generator is further for generating a third random sequence and a fourth random sequence by sampling a noise source, and for generating the first random sequence according to the third random sequence and the fourth random sequence.

12. The flash memory controller of claim 9, wherein the control unit is further for controlling the flash memory to store the first random sequence.

13. The flash memory controller of claim 12, wherein the control unit is further for controlling the flash memory to store the first random sequence and the scrambled data in a physical page.

14. The flash memory controller of claim 12, wherein:

the control unit is further for reading the first random sequence and the scrambled data from the flash memory;

the seed generator is further for generating the second random sequence according to the first random sequence;

the error correction circuit is further for performing an error correction decoding operation upon the first random sequence, the scrambled data and the parity check code; and the scrambling unit is further for performing a de-scrambling operation upon the scrambled data according to the second random sequence.

15. The flash memory controller of claim 9, wherein the data comprises a plurality of sectors, the seed generator is further for generating a set of seeds according to the first seed, and the scrambling unit is further for scrambling each sector of the sectors according to each seed of the set of seeds, respectively, for generating the scrambled data.

16. The flash memory controller of claim 15, wherein the seed generator is further for adding a set of predetermined number to the first seed for generating the set of seeds.

17. A method for accessing a flash memory, the method comprising:

obtaining a first random sequence;

utilizing the first random sequence as a first seed for generating a second random sequence, wherein the first random sequence is not equivalent to the second random sequence;

generating scrambled data according to the second random sequence; and storing the scrambled data to the flash memory, wherein the step of obtaining the first random sequence further comprises:

determining a physical address for storing the scrambled data, wherein the physical address is a page address or a block address of a storage device, and the scrambled data is arranged to be stored in the storage device according to the physical address; and selecting a specific value from a lookup table according to the physical address for generating the first random sequence, wherein the lookup table is arranged to store the relationship between the specific value and the physical address.

18. A flash memory controller for controlling a flash memory, the flash memory controller comprising:

a seed generator, for obtaining a first random sequence and for utilizing the first random sequence as a first seed for generating a second random sequence, wherein the first random sequence is not equivalent to the second random sequence;

a scrambling unit, coupled to the seed generator, for generating scrambled data according to the second random sequence, wherein the seed generator is further for determining a physical address for storing the scrambled data, and for selecting a specific value from a lookup table according to the physical address for generating the first random sequence, wherein the physical address is a page address or a block address of a storage device, the scrambled data is arranged to be stored in the storage device according to the physical address, and the lookup table is arranged to store the relationship between the specific value and the physical address; and a control unit, for controlling the flash memory to store the scrambled data.

* * * * *